(12) United States Patent
Kim

(10) Patent No.: US 10,110,227 B2
(45) Date of Patent: Oct. 23, 2018

(54) INTERNAL VOLTAGE GENERATION CIRCUIT

(71) Applicant: SK hynix Inc., Icheon-si, Gyeonggi-do (KR)

(72) Inventor: Yeon Uk Kim, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 7 days.

(21) Appl. No.: 15/609,353

(22) Filed: May 31, 2017

(65) Prior Publication Data

US 2018/0152186 A1    May 31, 2018

(30) Foreign Application Priority Data

Nov. 28, 2016    (KR) .................. 10-2016-0159691

(51) Int. Cl.
*H03K 19/003* (2006.01)
*H03K 5/24* (2006.01)

(52) U.S. Cl.
CPC ......... *H03K 19/00323* (2013.01); *H03K 5/24* (2013.01)

(58) Field of Classification Search
None
See application file for complete search history.

(56) References Cited

U.S. PATENT DOCUMENTS

| 9,966,934 | B2* | 5/2018 | Choi | H03K 17/6872 |
| 2005/0057291 | A1* | 3/2005 | Nguyen | H03K 5/1565 |
| | | | | 327/175 |
| 2008/0284508 | A1* | 11/2008 | Walker | H03F 3/217 |
| | | | | 330/10 |
| 2008/0309163 | A1* | 12/2008 | Hashimoto | H02J 7/0029 |
| | | | | 307/31 |
| 2009/0086555 | A1 | 4/2009 | Takeuchi | |
| 2011/0140768 | A1* | 6/2011 | Song | G05F 1/56 |
| | | | | 327/543 |
| 2011/0291632 | A1* | 12/2011 | Yu | H02M 3/158 |
| | | | | 323/283 |
| 2011/0309815 | A1* | 12/2011 | Yu | H02M 3/156 |
| | | | | 323/311 |
| 2012/0007632 | A1* | 1/2012 | Kang | G11C 7/04 |
| | | | | 326/30 |
| 2012/0062280 | A1* | 3/2012 | Yang | H03K 19/018585 |
| | | | | 327/108 |
| 2012/0169380 | A1* | 7/2012 | Kang | G11C 7/1051 |
| | | | | 327/108 |

(Continued)

FOREIGN PATENT DOCUMENTS

KR    1020130064370 A    6/2013

*Primary Examiner* — Crystal L Hammond
(74) *Attorney, Agent, or Firm* — William Park & Associates Ltd.

(57) ABSTRACT

An internal voltage generation circuit includes a comparison circuit, a driving signal generation circuit and a driving circuit. The comparison circuit generates a comparison signal from an internal voltage in response to a reference voltage. The driving signal generation circuit generates a pull-up driving signal and a pull-down driving signal having different duty ratios in response to the comparison signal. The driving circuit drives the internal voltage in response to the pull-up driving signal and the pull-down driving signal.

19 Claims, 13 Drawing Sheets

(56) References Cited

U.S. PATENT DOCUMENTS

| | | | |
|---|---|---|---|
| 2013/0076258 A1* | 3/2013 | Oshima | H02M 3/157 315/209 R |
| 2013/0076259 A1* | 3/2013 | Oshima | H02M 3/157 315/209 R |
| 2013/0234682 A1* | 9/2013 | Yoon | G05F 1/625 323/234 |
| 2014/0055003 A1* | 2/2014 | Nielsen | B06B 1/0215 310/317 |

\* cited by examiner

INTERNAL VOLTAGE GENERATION CIRCUIT

CROSS-REFERENCE TO RELATED APPLICATION

The present application claims priority under 35 U.S.C. § 119(a) to Korean application number 10-2016-0159691, filed on Nov. 28, 2016, in the Korean Intellectual Property Office, which is incorporated herein by reference in its entirety.

BACKGROUND

1. Technical Field

Embodiments of the present disclosure relate to an internal voltage generation circuit generating an internal voltage.

2. Related Art

In general, semiconductor memory devices receive a power supply voltage VDD and a ground voltage VSS from an external system to generate internal voltages used in operations of internal circuits constituting each semiconductor memory device. The internal voltages for operating the internal circuits of the semiconductor memory devices may include a core voltage VCORE supplied to memory core regions, a high voltage VPP used to drive or overdrive word lines, and a back-bias voltage VBB applied to a bulk region (or a substrate) of NMOS transistors in the memory core region.

The core voltage VCORE may be a positive voltage which is lower than the power supply voltage VDD supplied from the external system. Thus, the core voltage VCORE may be generated by lowering the power supply voltage VDD to a certain level. In contrast, the high voltage VPP may be higher than the power supply voltage VDD, and the back-bias voltage VBB may be a negative voltage which is lower than the ground voltage VSS. Thus, charge pump circuits may be required to generate the high voltage VPP and the back-bias voltage VBB.

SUMMARY

Various embodiments are directed to an internal voltage generation circuit capable of minimizing a dead zone.

According to an embodiment, an internal voltage generation circuit includes a comparison circuit, a driving signal generation circuit and a driving circuit. The comparison circuit generates a comparison signal from an internal voltage in response to a reference voltage. The driving signal generation circuit generates a pull-up driving signal and a pull-down driving signal having different duty ratios in response to the comparison signal. The driving circuit drives the internal voltage in response to the pull-up driving signal and the pull-down driving signal.

According to another embodiment, an internal voltage generation circuit includes a first comparison circuit, a first driving signal generation circuit, a second comparison circuit, and a second driving signal generation circuit. The first comparison circuit generates a first comparison signal from an internal voltage in response to a reference voltage. The first driving signal generation circuit generates a first pull-up driving signal and a first pull-down driving signal having different duty ratios in response to the first comparison signal. The second comparison circuit generates a second comparison signal from the internal voltage in response to the reference voltage. The second driving signal generation circuit generates a second pull-up driving signal and a second pull-down driving signal in response to the second comparison signal, the first pull-up driving signal, and the first pull-down driving signal. The second comparison signal has a first logic level when the internal voltage is a lower level than the reference voltage by a predetermined first voltage difference or more.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
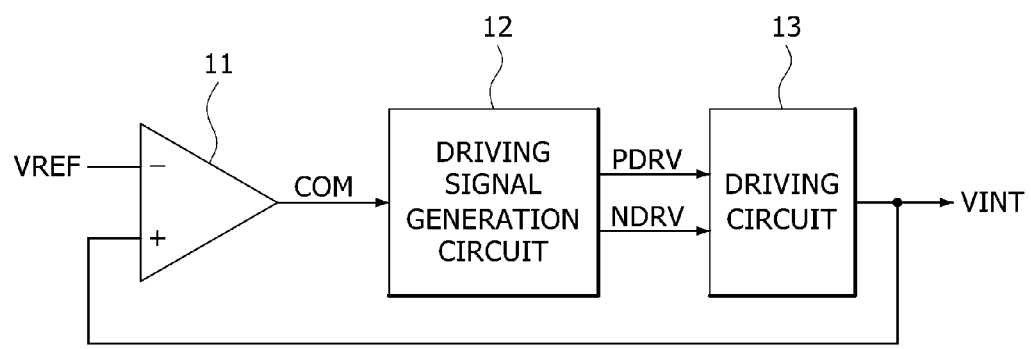
FIG. 1 is a block diagram illustrating a configuration of an internal voltage generation circuit according to an embodiment.

As shown in FIG. 1, an internal voltage generation circuit 1 in accordance with an embodiment may include a comparison circuit 11, a driving signal generation circuit 12, and a driving circuit 13. The comparison circuit 11 may generate a comparison signal COM from an internal voltage VINT in response to a reference voltage VREF. The comparison circuit 11 may generate the comparison signal COM whose logic level is determined according to a comparison result of the reference voltage VREF and the internal voltage VINT. For example, the comparison circuit 11 may generate the comparison signal COM having a logic high-level when the internal voltage VINT is at a level higher than the reference voltage VREF, and generate the comparison signal COM having a logic low level when the internal voltage VINT is at a lower level than the reference voltage VREF. A level of the reference voltage VREF may be set at various levels according to the embodiment. A logic level of the comparison signal COM according to the comparison result of the internal voltage VINT and the reference voltage VREF may be set differently according to the embodiment.

The driving signal generation circuit 12 may generate a pull-up driving signal PDRV and a pull-down driving signal NDRV in response to the comparison signal COM. The driving signal generation circuit 12 may generate the pull-up driving signal PDRV and the pull-down driving signal NDRV having different duty ratios according to a level of the comparison signal COM. The duty ratio may be defined as a ratio of a logic high level having a period of one cycle. In this embodiment, the duty ratio of the pull-up driving signal PDRV may be set to be larger than the duty ratio of the pull-down driving signal NDRV. The driving signal generating circuit 12 may generate the pull-up driving signal PDRV which is set to a logic high level in synchronization with a time when the comparison signal COM transitions from a logic low level to a logic high level. The driving signal generation circuit 12 may generate the pull-down driving signal NDRV which is set to a logic high level when a predetermined delay period has elapsed from a time when the pull-up driving signal PDRV is set to a logic high level. The driving signal generation circuit 12 may generate the pull-down driving signal NDRV which is set to a logic low level in synchronization with a time when the comparison signal COM transitions from a logic high level to a logic low level. The driving signal generation circuit 12 may generate the pull-up driving signal PDRV which is set to a logic low level at a time when the predetermined delay period has elapsed from a time when the pull-down driving signal NDRV was set to a logic low level. The logic level of the pull-up driving signal PDRV and the logic level of the pull-down driving signal NDRV set according to a logic level of the comparison signal COM may be variously set according to the embodiment. The predetermined delay period may be set to various periods according to the embodiment.

The driving circuit 13 may drive the internal voltage VINT in response to the pull-up driving signal PDRV and the pull-down driving signal NDRV. The drive circuit 13 may pull-up drive the internal voltage VINT in response to the pull-up driving signal PDRV. The driving circuit 13 may pull-down drive the internal voltage VINT in response to the pull-down driving signal NDRV. A pull-up driving operation of the internal voltage VINT in this embodiment may mean that the internal voltage VINT is driven at a level of a power supply voltage and a pull-down driving operation of the internal voltage VINT may mean that the internal voltage VINT is driven at a level of a ground voltage. The logic level of the pull-up driving signal PDRV capable of pulling up the internal voltage VINT and the logic level of the pull down driving signal NDRV capable of pulling down the internal voltage VINT may be set differently according to the embodiment.

Figure 2:
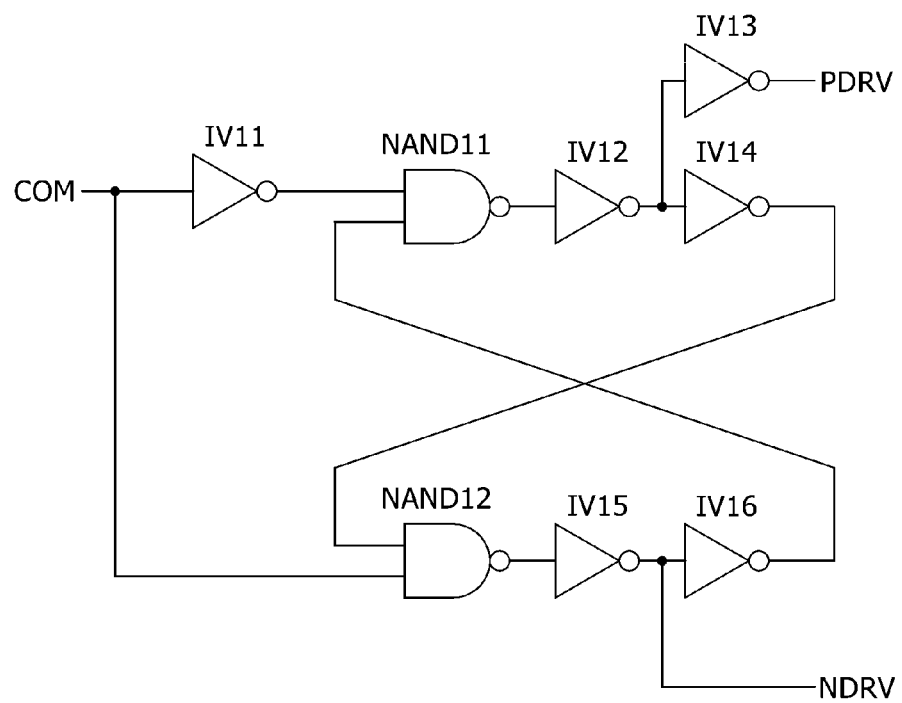
FIG. 2 is a circuit diagram illustrating a configuration of an embodiment of a driving signal generation circuit included in the internal voltage generation circuit of FIG. 1.

Referring to FIG. 2, the driving signal generation circuit 12 may include inverters IV11 to IV16 and NAND gates NAND11 and NAND12.

The driving signal generation circuit 12 may generate the pull-up driving signal PDRV which is set to a logic high level through the inverter IV11, the NAND gate NAND11, the inverter IV12, and the inverter IV13 when the comparison signal COM transitions from a logic low level to a logic high level. The driving signal generation circuit 12 may generate the pull-down driving signal NDRV which is set to a logic high level through the inverter IV11, the NAND gate NAND11, the inverter IV12, the inverter IV14, the NAND gate NAND12, and the inverter IV15 when the comparison signal COM transitions from a logic low level to a logic high level. The pull-down driving signal NDRV may be set to a logic high level when a predetermined period has elapsed from time when the pull-up driving signal PDRV is set to a logic high level. The driving signal generation circuit 12 may generate the pull-down driving signal NDRV which is set to a logic low level through the NAND gate NAND12 and the inverter IV15 when the comparison signal COM transitions from a logic high level to a logic low level. The driving signal generation circuit 12 may generate the pull-up driving signal PDRV which is set to a logic low level through the NAND gate NAND12, the inverter IV15, the inverter IV16, the inverter IV11, the NAND gate NAND11, the inverter IV12 and the inverter IV13 when the comparison signal COM transitions from a logic high level to a logic low level. The pull-up driving signal PDRV may be set to a logic low level when a predetermined period has elapsed from time when the pull-down driving signal NDRV is set to a logic low level.

Figure 3:
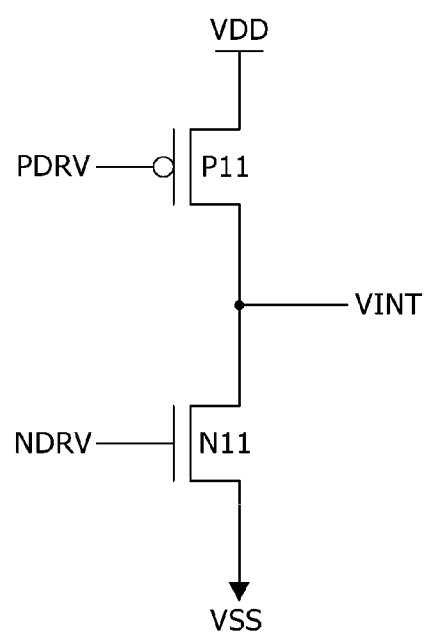
FIG. 3 is a circuit diagram illustrating a configuration of an embodiment of a driving circuit included in the internal voltage generation circuit of FIG. 1.

Referring to FIG. 3, the driving circuit 13 may include a PMOS transistor P11 and an NMOS transistor N11. The PMOS transistor P11 may pull-up drive the internal voltage VINT in response to the pull-up driving signal PDRV. The PMOS transistor P11 is turned on when the pull-up driving signal PDRV set to a logic low level is input, and may pull-up drive the internal voltage VINT to a power supply voltage VDD. The NMOS transistor N11 may pull-down drive the internal voltage VINT in response to the pull-down driving signal NDRV. The NMOS transistor N11 is turned on when the pull-down driving signal NDRV set to a logic high level is input, and may pull-down drive the internal voltage VINT to a ground voltage VSS.

Figure 4:
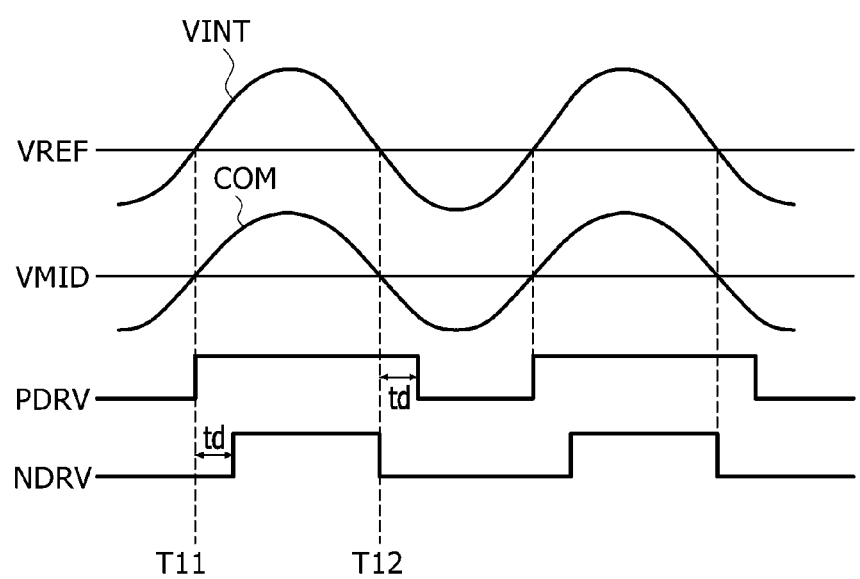
FIG. 4 is a timing diagram illustrating an operation of the internal voltage generation circuit of FIG. 1.

An operation of the internal voltage generation circuit 1 having the aforementioned configuration will be described hereinafter with reference to FIG. 4. At a time T11 when the internal voltage VINT becomes larger than the reference voltage VREF, the comparison signal COM changes from a state in which the comparison signal COM is smaller than the intermediate voltage VMID to a state in which the comparison signal COM is larger than the intermediate voltage VMID. At time T11 it is assumed that the comparison signal COM transits from a logic low level to a logic high level. At a time T12 when the internal voltage VINT becomes smaller than the reference voltage VREF, the comparison signal COM changes from a state in which the comparison signal COM is larger than the intermediate voltage VMID to a state in which the comparison signal COM is smaller than the intermediate voltage VMID. At time T12 it is assumed that the comparison signal COM transits from a logic high level to a logic low level.

At a time T11, the pull-up driving signal PDRV is set to a logic high level in synchronization with a time when the comparison signal COM transitions from a logic low level to a logic high level, and the pull-down driving signal NDRV is set to a logic high level in synchronization with a time when a predetermined delay period td has elapsed from time when the pull-up driving signal PDRV is set to a logic high level. In other words, at time T11, the pull-up driving signal PDRV may be set to a logic high level in synchronization with a time that the internal voltage VINT becomes higher than the reference voltage VREF. Because the pull-down driving signal NDRV is set to a logic high level when the predetermined delay period td has elapsed where the predetermined delay period td starts when the pull-up driving signal PDRV is set to a logic high level, a pull-down driving operation of the internal voltage VINT is started after a pull-up driving operation of the internal voltage VINT is stopped. Therefore, the dead zone in which the pull-up driving operation and the pull-down driving operation are performed is simultaneously minimized.

At a time T12, the pull-down driving signal NDRV is set to a logic low level in synchronization with a time when the comparison signal COM transitions from a logic high level to a logic low level, and the pull-up driving signal PDRV is set to a logic low level in synchronization with a time when a predetermined delay period td has elapsed from a time when the pull-down driving signal NDRV is set to a logic low level. In other words, at time T12, the pull down driving signal NDRV may be set to the logic low level in synchronization with a time that the internal voltage VINT becomes lower than the reference voltage VREF. Because the pull-up driving signal PDRV is set to a logic low level when the predetermined delay period td has elapsed where the predetermined delay period td starts when the pull-down driving signal NDRV is set to a logic low level, the pull-up driving operation of the internal voltage VINT is started after the pull-down driving operation of the internal voltage VINT is stopped. Therefore, the dead zone in which the pull-up driving operation and the pull-down driving operation are performed is simultaneously minimized.

As described above, as pertains to the internal voltage generating circuit 1, the duty ratio of the pull-up driving signal PDRV for controlling a pull-up driving operation associated with the internal voltage VINT is set to be larger than the duty ratio of the pull-down driving signal NDRV for controlling a pull-down driving operation associated with the internal voltage VINT. That is, the pull-down driving signal NDRV is set to a logic high level in synchronization with a time when a predetermined delay period td has elapsed from a time when the pull-up driving signal PDRV is set to a logic high level, and the pull-up driving signal PDRV is set to a logic low level when the delay period td has elapsed from a time when the pull-down driving signal NDRV is set to a logic low level. Therefore, because a pull-down driving operation of the internal voltage VINT is started after a pull-up driving operation of the internal voltage VINT is stopped, and a pull-up driving operation of the internal voltage VINT is started after a pull-down driving operation of the internal voltage VINT is stopped, the dead zone in which the pull-up driving operation and the pull-down driving operation are performed is simultaneously minimized.

Figure 5:
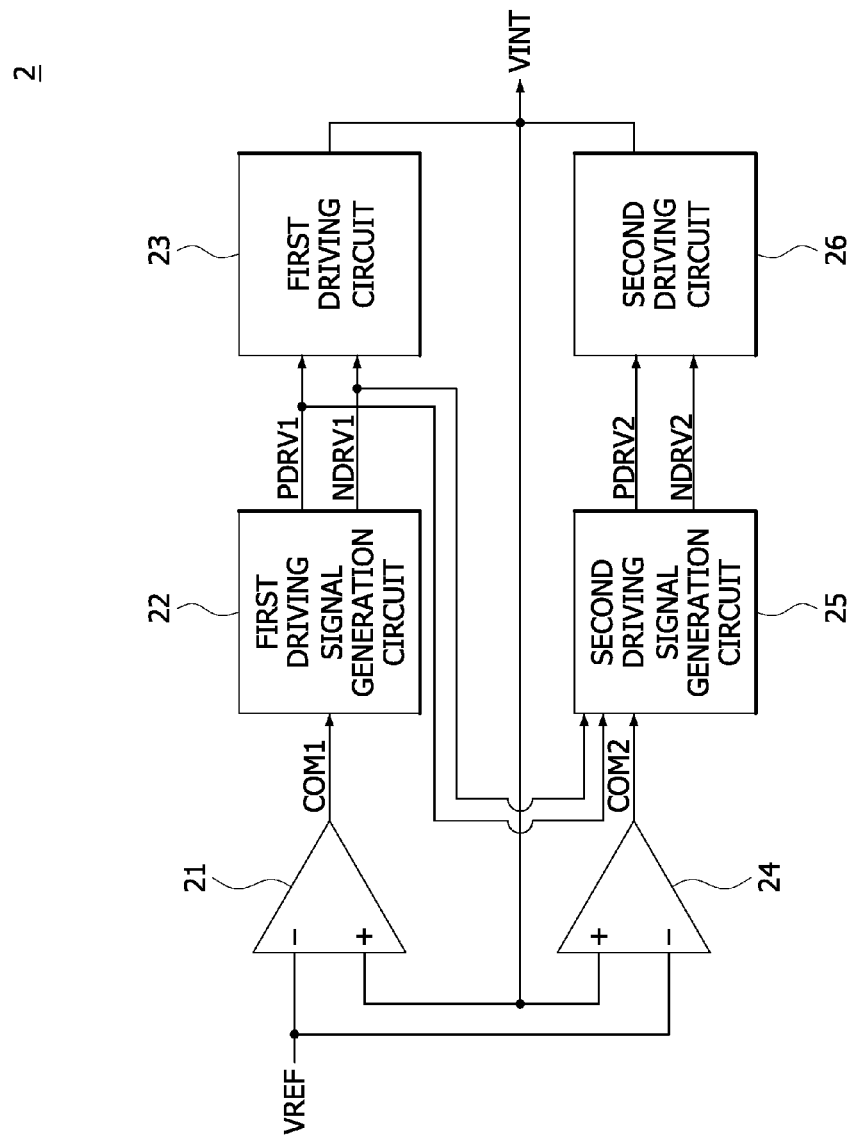
FIG. 5 is a block diagram illustrating a configuration of an internal voltage generation circuit according to another embodiment.

As shown in FIG. 5, an internal voltage generation circuit 2 accordance with another embodiment may include a first comparison circuit 21, a first driving signal generation circuit 22, a first driving circuit 23, a second comparison circuit 24, a second driving signal generation circuit 25, and a second driving circuit 26.

The first comparison circuit 21 may generate a first comparison signal COM1 from an internal voltage VINT in response to a reference voltage VREF. The first comparison circuit 21 may generate the first comparison signal COM1 whose logic level is determined according to the comparison result of the reference voltage VREF and the internal voltage VINT. For example, the first comparison circuit 21 may generate the first comparison signal COM1 having a logic high level when the internal voltage VINT is at a level higher than the reference voltage VREF and generate the first comparison signal COM1 having a logic low level when the internal voltage VINT is at a lower level than the reference voltage VREF. A level of the reference voltage VREF may be set at various levels according to the embodiment. According to the embodiment, a logic level of the first comparison signal COM1 may be set differently according to the comparison result of the internal voltage VINT and the reference voltage VREF.

The first driving signal generation circuit 22 may generate a first pull-up driving signal PDRV1 and a first pull-down driving signal NDRV1 in response to the first comparison signal COM1. The first driving signal generation circuit 22 generates the first pull-up driving signal PDRV1 and the first pull-down driving signal NDRV1 having different duty ratios according to a level of the first comparison signal COM1. The duty ratio may be defined as a ratio of a logic high level having a period of one cycle. In this embodiment, a duty ratio of the first pull-up driving signal PDRV1 may be set to be larger than a duty ratio of the first pull-down driving signal NDRV1. The first driving signal generation circuit 22 may generate the first pull-up driving signal PDRV1 which is set to a logic high level in synchronization with a time when the first comparison signal COM transitions from a logic low level to a logic high level. The first driving signal generation circuit 22 may generate the first pull-down driving signal NDRV1 which is set to a logic high level when a predetermined delay period has elapsed where the predetermined delay period starts when the first pull-up driving signal PDRV1 was set to a logic high level. The first driving signal generation circuit 22 may generate the first pull-down driving signal NDRV1 which is set to a logic low level in synchronization with a time when the first comparison signal COM1 transitions from a logic high level to a logic low level. The first driving signal generation circuit 22 may generate the first pull-up driving signal PDRV1 which is set to a logic low level when the predetermined delay period has elapsed where the predetermined delay period starts when the first pull-down driving signal NDRV1 is set to a logic low level. The logic level of the first pull-up driving signal PDRV1 and the logic level of the first pull-down driving signal NDRV1 set according to a logic level of the first comparison signal COM1 may be variously set according to the embodiment. The predetermined delay period may be set to various periods according to the embodiment.

The first driving circuit 23 may drive the internal voltage VINT in response to the first pull-up driving signal PDRV1 and the first pull-down driving signal NDRV1. The first driving circuit 23 may pull-up drive the internal voltage VINT in response to the first pull-up driving signal PDRV1. The first driving circuit 23 may pull-down drive the internal voltage VINT in response to the first pull-down driving signal NDRV1. A pull-up operation of the internal voltage VINT in this embodiment means that the internal voltage VINT is driven at a level of a power supply voltage and a pull-down operation of the internal voltage VINT means that the internal voltage VINT is driven at a level of a ground voltage. The logic level of the first pull-up driving signal PDRV1 capable of pulling up the internal voltage VINT and the logic level of the first pull-down driving signal NDRV1 capable of pulling down the internal voltage VINT may be set differently according to the embodiment.

The second comparison circuit 24 may generate a second comparison signal COM2 from the internal voltage VINT in response to the reference voltage VREF. The second comparison circuit 24 may generate the second comparison signal COM2 having a logic low level when the internal voltage VINT is a lower level than the reference voltage VREF by a predetermined first voltage difference or more. The second comparison circuit 24 may generate the second comparison signal COM2 having a logic high level when the internal voltage VINT is a level higher than the reference voltage VREF by a predetermined second voltage difference or more. The second comparison circuit 24 may generate the second comparison signal COM2 having a level of an intermediate voltage VMID when a level of the internal voltage VINT is included in a period which ranges from a level that is smaller than the reference voltage VREF by a predetermined first voltage difference to a level that is larger than the reference voltage VREF by a predetermined second voltage difference. The first voltage difference and the second voltage difference may be variously set according to the embodiment. The level of the intermediate voltage VMID may be set to set a logic level and may be set to various sizes according to the embodiment.

The second driving signal generation circuit 25 may generate a second pull-up driving signal PDRV2 and a second pull-down driving signal NDRV2 in response to the second comparison signal COM2, the first pull-up driving signal PDRV1, and the first pull-down driving signal NDRV1. The second driving signal generation circuit 25 may generate the second pull-up driving signal PDRV2 which is set to a logic low level in response to the first pull-up driving signal PDRV1 and the second comparison signal COM2 to pull-up drive the internal voltage VINT. The second driving signal generation circuit 25 may generate the second pull-up driving signal PDRV2 which is set to a logic low level in synchronization with a time when the second comparison signal COM2 transitions to a logic low level when the first pull-up driving signal PDRV1 is set to a logic low level to pull-up drive the internal voltage VINT. The second driving signal generation circuit 25 may generate a second pull-down driving signal NDRV2 which is set to a logic high level in response to the first pull-down driving signal NDRV1 and the second comparison signal COM2 to pull-down drive the internal voltage VINT. The second driving signal generation circuit 25 may generate the second pull-down driving signal NDRV2 which is set to a logic high level in synchronization with a time when the second comparison signal COM2 transitions to a logic high level when the first pull-down driving signal NDRV1 is set to a logic high level to pull-down drive the internal voltage VINT.

The second driving circuit 26 may drive the internal voltage VINT in response to the second pull-up driving signal PDRV2 and the second pull-down driving signal NDRV2. The second driving circuit 26 may pull-up drive the internal voltage VINT in response to the second pull-up driving signal PDRV2. The second driving circuit 26 may pull-down drive the internal voltage VINT in response to the second pull-down driving signal NDRV2. The logic level of the second pull-up driving signal PDRV2, capable of pulling up the internal voltage VINT, and the logic level of the second pull-down driving signal NDRV2, capable of pulling down the internal voltage VINT, may be set differently according to the embodiment.

Figure 6:
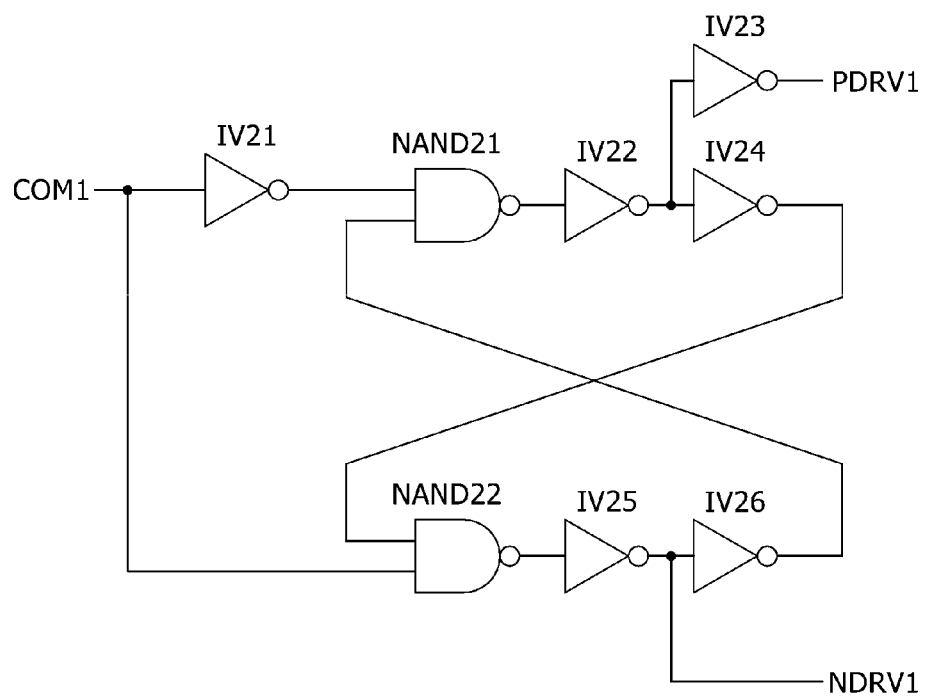
FIG. 6 is a circuit diagram illustrating a configuration of an embodiment of a first driving signal generation circuit included in the internal voltage generation circuit of FIG. 5.

Referring to FIG. 6, the first driving signal generation circuit 22 may include inverters IV21 to IV26 and NAND gates NAND21 and NAND22.

The first driving signal generation circuit 22 may generate the first pull-up driving signal PDRV1 which is set to a logic high level through the inverter IV21, the NAND gate NAND21, the inverter IV22, and the inverter IV23 when the first comparison signal COM1 transitions from a logic low level to a logic high level. The driving signal generation circuit 22 may generate the first pull-down driving signal NDRV1 which is set to a logic high level through the inverter IV21, the NAND gate NAND21, the inverter IV22, the inverter IV24, the NAND gate NAND22, and the inverter IV25 when the first comparison signal COM1 transitions from a logic low level to a logic high level. The first pull-down driving signal NDRV1 may be set to a logic high level when a predetermined period has elapsed where the predetermined delay period starts when the first pull-up driving signal PDRV1 is set to a logic high level. The first driving signal generation circuit 22 may generate the first pull-down driving signal NDRV1 which is set to a logic low level through the NAND gate NAND22 and the inverter IV25 when the first comparison signal COM1 transitions from a logic high level to a logic low level. The first driving signal generation circuit 22 may generate the first pull-up driving signal PDRV1 which is set to a logic low level through the NAND gate NAND22, the inverter IV25, the inverter IV26, the inverter IV21, the NAND gate NAND21, the inverter IV22, and the inverter IV23 when the first comparison signal COM1 transitions from a logic high level to a logic low level. The first pull-up driving signal PDRV1 may be set to a logic low level when a predetermined period has elapsed where the predetermined delay period starts when the first pull-down driving signal NDRV1 is set to a logic low level.

Figure 7:
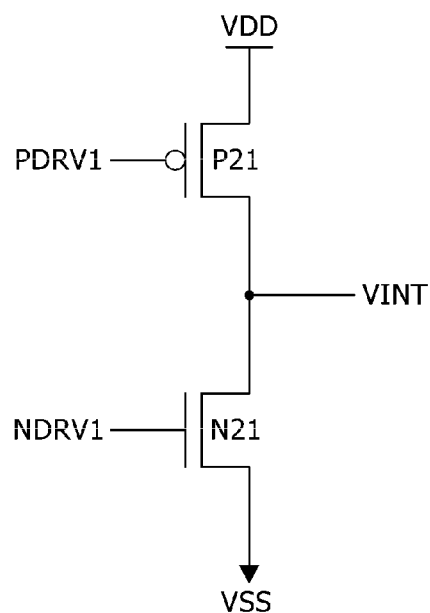
FIG. 7 is a circuit diagram illustrating a configuration of an embodiment of a first driving circuit included in the internal voltage generation circuit of FIG. 5.

Referring to FIG. 7, the first driving circuit 23 may include a PMOS transistor P21 and an NMOS transistor N21. The PMOS transistor P21 may pull-up drive the internal voltage VINT in response to the first pull-up driving signal PDRV1. The PMOS transistor P21 may be turned on when the first pull-up driving signal PDRV1 set to a logic low level is input, and may pull-up drive the internal voltage VINT to a power supply voltage VDD. The NMOS transistor N21 may pull-down drive the internal voltage VINT in response to the first pull-down driving signal NDRV1. The NMOS transistor N21 may be turned on when the first pull-down driving signal NDRV1 set to a logic high level is input, and pulls down the internal voltage VINT to a ground voltage VSS.

Figure 8:
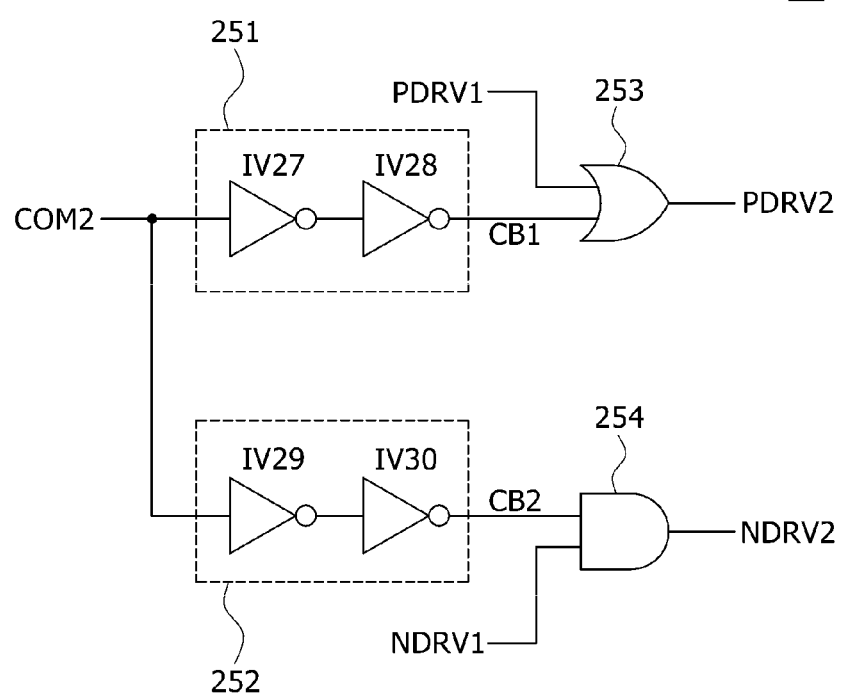
FIG. 8 is a circuit diagram illustrating a configuration of an embodiment of a second driving signal generation circuit included in the internal voltage generation circuit of FIG. 5.

Referring to FIG. 8, the second driving signal generation circuit 25 may include a first buffer circuit 251, a second buffer circuit 252, a first logic element 253, and a second logic element 254. The first buffer circuit 251 may include inverters IV27 and IV28. The first buffer circuit 251 may buffer the second comparison signal COM2 to generate the first buffer comparison signal CB1. The second buffer circuit 252 may include inverters IV29 and IV30. The second buffer circuit 252 may buffer the second comparison signal COM2 to generate the second buffer comparison signal CB2. The first logic element 253 may be implemented as an OR gate that receives the first buffer comparison signal CB1 and the first pull-up driving signal PDRV1 and performs an OR operation on the first buffer comparison signal CB1 and the first pull-up driving signal PDRV1. The second logic element 254 may be implemented as an AND gate that receives the second buffer comparison signal CB2 and the first pull-down driving signal NDRV1 and performs an AND operation on the second buffer comparison signal CB2 and the first pull-down driving signal NDRV1.

The second driving signal generation circuit 25 may generate the second pull-up driving signal PDRV2 which is set to a logic low level to pull-up drive the internal voltage VINT when the second comparison signal COM2 transitions to a logic low level when the first pull-up driving signal PDRV1 is set to a logic low level. The second driving signal generation circuit 25 may generate the second pull-down driving signal NDRV2 which is set to a logic high level to pull-down drive the internal voltage VINT when the second comparison signal COM2 transitions to a logic high level when the first pull-down driving signal NDRV1 is set to a logic high level.

Figure 9:
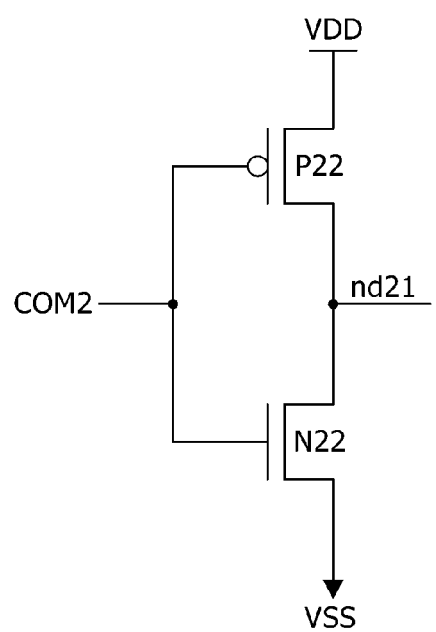
FIG. 9 and FIG. 10 are circuit diagrams illustrating embodiments of inverters included in the second driving signal generation circuit of FIG. 8.

As shown in FIG. 9, the inverter IV27 included in the first buffer circuit 251 may include a PMOS transistor P22 and an NMOS transistor N22. The PMOS transistor P22 may be turned on by the power supply voltage VDD to pull-up drive the output node nd21 when the second comparison signal COM2 is at a logic low level. The NMOS transistor N22 may be turned on by the ground voltage VSS to pull-down drive the output node nd21 when the second comparison signal COM2 is at a logic high level. In this embodiment, the NMOS transistor N22 may be a larger size than that of the PMOS transistor P22. In this case, a pull-down drivability of the inverter IV27 may be greater than a pull-up drivability of the inverter IV27.

Figure 10:
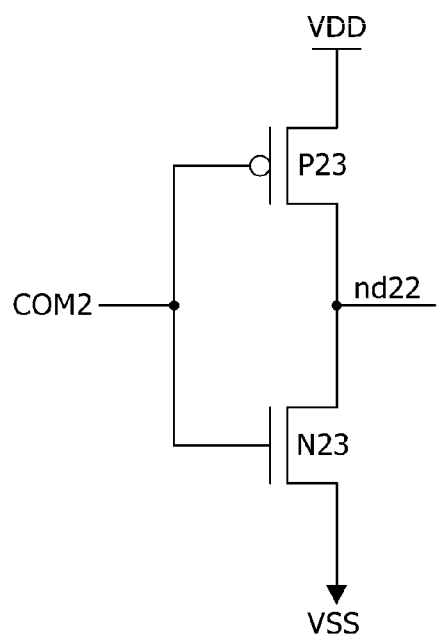

As shown in FIG. 10, the inverter IV29 included in the second buffer circuit 252 may include a PMOS transistor P23 and an NMOS transistor N23. The PMOS transistor P23 may be turned on by the power supply voltage VDD to pull-up drive an output node ND22 when the second comparison signal COM2 is at a logic low level. The NMOS transistor N23 may be turned on by the ground voltage VSS to pull-down drive the output node ND22 when the second comparison signal COM2 is at a logic high level. In this embodiment, the PMOS transistor P23 may be a larger size than the NMOS transistor N23. In this case, a pull-up drivability of the inverter IV29 may be greater than a pull-up drivability of the inverter IV29.

Figure 11:
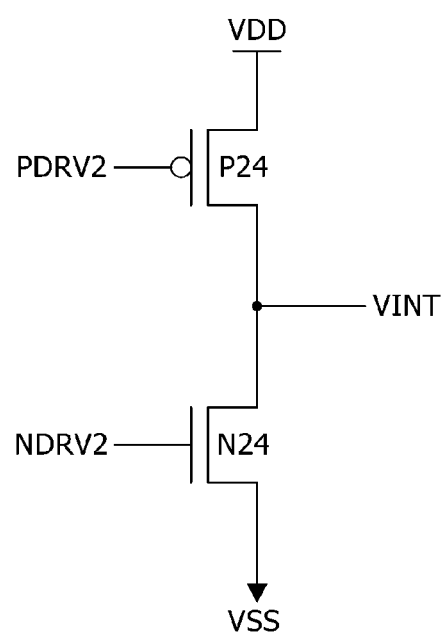
FIG. 11 is a circuit diagram illustrating a configuration of an embodiment of a second driving circuit included in the internal voltage generation circuit of FIG. 5.

Referring to FIG. 11, the second driving circuit 26 may include a PMOS transistor P24 and an NMOS transistor N24. The PMOS transistor P24 may pull-up drive the internal voltage VINT in response to the second pull-up driving signal PDRV2. The PMOS transistor P24 may be turned on when the second pull-up driving signal PDRV2 set to a logic low level is input, and may pull-up drive the internal voltage VINT to the power supply voltage VDD. The NMOS transistor N24 may pull-down drive the internal voltage VINT in response to the second pull-down driving signal NDRV2. The NMOS transistor N24 may be turned on when the second pull-down driving signal NDRV2 set to a logic high level is input, and may pull-down drive the internal voltage VINT to the ground voltage VSS. The PMOS transistor P24 and the NMOS transistor N24 may be a larger size than the PMOS transistor P21 and the NMOS transistor N21 included in the first driving circuit 23. Therefore, the second driving circuit 26 may drive the internal voltage VINT with a larger drivability than that of the first driving circuit 23.

Figure 12:
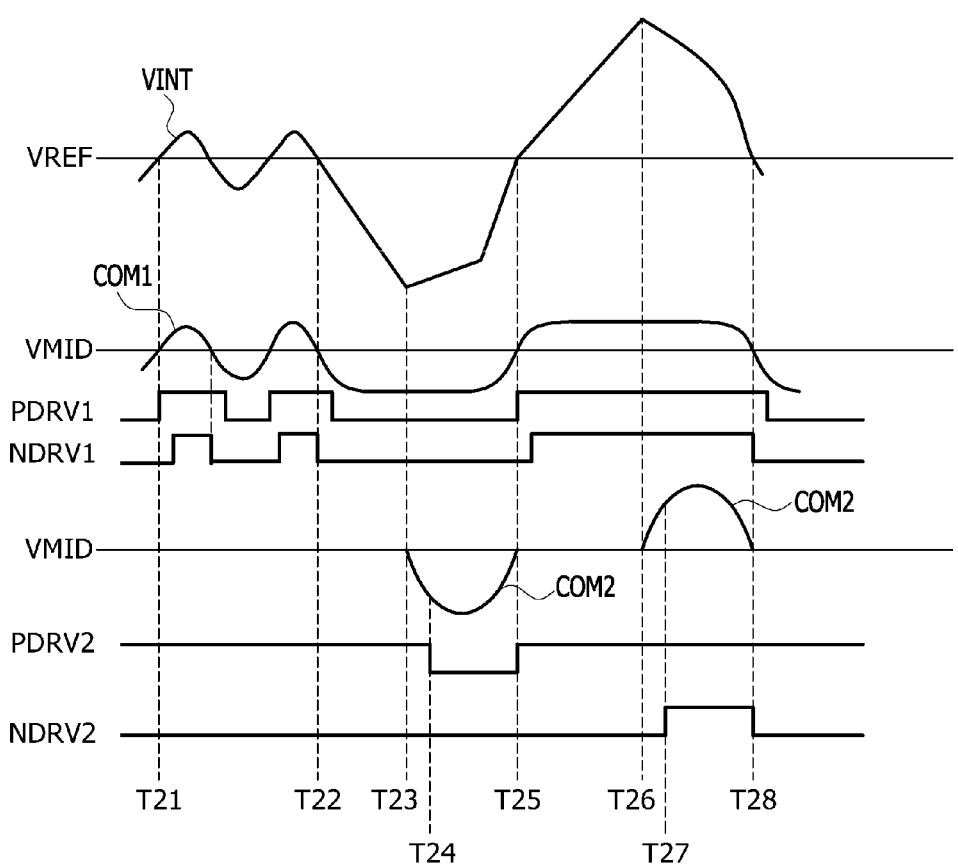
FIG. 12 is a timing diagram illustrating an operation of the internal voltage generation circuit of FIG. 5.

An operation of the internal voltage generation circuit 2 having the aforementioned configuration will be described hereinafter with reference to FIG. 12.

During the period from T21 to T22 a duty ratio of the first pull-up driving signal PDRV1 is set to be larger than a duty ratio of the first pull-down driving signal NDRV1. A case where a level of the internal voltage VINT changes to be equal to or less than a predetermined voltage difference in the reference voltage VREF, as in the operation of the internal voltage generation circuit 1 is described with reference to FIGS. 1 to 4.

At time T23, the second comparison signal COM2 has a logic low level when a level of the internal voltage VINT is lower than the reference voltage VREF by a predetermined first voltage difference or more.

During a period from T24 to T25, the second pull-up driving signal PDRV2 is set to a logic low level by the second comparison signal COM2 having a logic low level. Therefore, a level of the internal voltage VINT may be rapidly increased by driving the internal voltage VINT with a large drivability.

At time T26, the second comparison signal COM2 has a logic high level when a level of the internal voltage VINT is higher than the reference voltage VREF by a predetermined second voltage difference or more.

During the period from T27 to T28, the second pull-down driving signal NDRV2 is set to a logic high level by the second comparison signal COM2 having a logic high level. Therefore, a level of the internal voltage VINT may be rapidly reduced by driving the internal voltage VINT to a large drivability.

Figure 13:
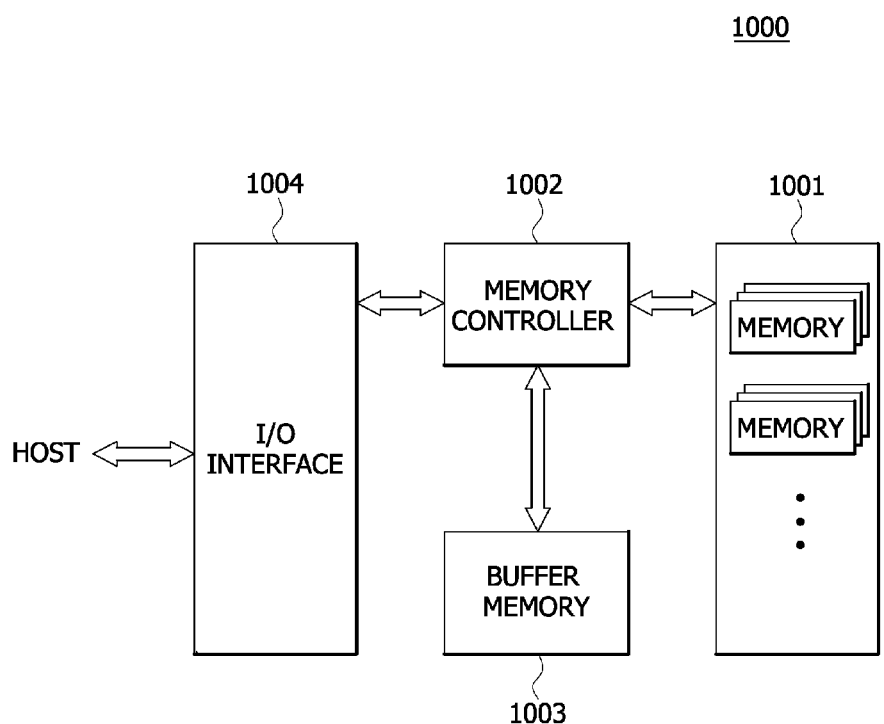
FIG. 13 is a block diagram illustrating a configuration of an electronic system employing the internal voltage generation circuit shown in FIGS. 1 and 5.

The internal voltage generation circuit described with reference to FIGS. 1 to 12 may be applied to an electronic system that includes a memory system, a graphic system, a computing system, a mobile system, or the like. For example, as illustrated in FIG. 13, an electronic system 1000 according an embodiment may include a data storage circuit 1001, a memory controller 1002, a buffer memory 1003, and an input/output (I/O) interface 1004.

The data storage circuit 1001 may store data which is outputted from the memory controller 1002 or may read and output the stored data to the memory controller 1002, according to a control signal generated from the memory controller 1002. The data storage circuit 1001 may generate internal data having a logic level which is internally set regardless of data inputted from an external device and may perform an initialization operation of storing the internal data in a memory cell array. The data storage circuit 1001 may include an on-die termination (ODT) circuit (not illustrated) for preventing distortion of data. The ODT circuit may be designed not to operate during an initialization operation of the data storage circuit 1001. In addition, the data storage circuit 1001 may include a nonvolatile memory that can retain stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may apply data and a strobe signal for strobing the data to the data storage circuit 1001. The strobe signal outputted from the memory controller 1002 may not be toggled during the initialization operation and may be toggled after the initialization operation terminates. Although FIG. 13 illustrates the memory controller 1002 as a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which is processed by the memory controller 1002. That is, the buffer memory 1003 may temporarily store the data which is outputted from or inputted to the data storage circuit 1001. The buffer memory 1003 may store the data, which is outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (DATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

According to the present disclosure, an internal voltage may be stably generated by minimizing a dead zone.

In addition, according to the present disclosure, the internal voltage may be stabilized at a high speed by driving the internal voltage with a large drivability when the level of the internal voltage fluctuates abruptly.

What is claimed is:

1. An internal voltage generation circuit comprising:
   a comparison circuit configured to generate a comparison signal from an internal voltage in response to a reference voltage;
   a driving signal generation circuit configured to generate a pull-up driving signal and a pull-down driving signal having different duty ratios in response to the comparison signal; and
   a driving circuit configured to drive the internal voltage in response to the pull-up driving signal and the pull-down driving signal, wherein the pull-up driving signal is set to a first logic level in synchronization with a time when the comparison signal transitions from a second logic level to the first logic level, and wherein the pull-down driving signal is set to the first logic level when a predetermined delay period has elapsed where the predetermined delay period starts when the pull-up driving signal is set to the first logic level.

2. The internal voltage generation circuit of claim 1, wherein the comparison circuit generates the comparison signal having the first logic level when the internal voltage is at a higher level than the reference voltage, and generates the comparison signal having the second logic level when the internal voltage is at a lower level than the reference voltage.

3. The internal voltage generation circuit of claim 1, wherein the duty ratio is a ratio of the first logic level having a period of one cycle.

4. The internal voltage generation circuit of claim 1, wherein a duty ratio of the pull-up driving signal is set to be greater than a duty ratio of the pull-down driving signal.

5. The internal voltage generation circuit of claim 1, wherein the pull-up driving signal is set to the first logic level in synchronization with a time when the internal voltage becomes higher than the reference voltage, and wherein the pull-down driving signal is set to the first logic level when the predetermined delay period has elapsed where the predetermined delay period starts when the pull-up driving signal is set to the first logic level.

6. The internal voltage generation circuit of claim 1, wherein the pull-down driving signal is set to the second logic level in synchronization with a time when the internal voltage becomes lower than the reference voltage, and wherein the pull-up driving signal is set to the second logic level when the predetermined delay period has elapsed from a time when the pull-down driving signal is set to the second logic level.

7. The internal voltage generation circuit of claim 1, wherein the pull-down driving signal is set to the second logic level in synchronization with a time when the comparison signal transitions from the first logic level to the second logic level, and wherein the pull-up driving signal is set to the second logic level when the predetermined delay period has elapsed where the predetermined delay period starts when the pull-down driving signal is set to the second logic level.

8. The internal voltage generation circuit of claim 1, wherein the driving circuit pull-up drives the internal voltage in response to the pull-up driving signal and wherein the driving circuit pull-down drives the internal voltage in response to the pull-down driving signal.

9. An internal voltage generation circuit comprising:
   a first comparison circuit configured to generate a first comparison signal from an internal voltage in response to a reference voltage;
   a first driving signal generation circuit configured to generate a first pull-up driving signal and a first pull-down driving signal having different duty ratios in response to the first comparison signal;
   a second comparison circuit configured to generate a second comparison signal from the internal voltage in response to the reference voltage; and
   a second driving signal generation circuit configured to generate a second pull-up driving signal and a second pull-down driving signal in response to the second comparison signal, the first pull-up driving signal, and the first pull-down driving signal,
   wherein the second comparison signal has a first logic level when the internal voltage is a lower level than the reference voltage by a predetermined first voltage difference or more.

10. The internal voltage generation circuit of claim 9, wherein the second driving signal generation circuit generates the second pull-up driving signal having a logic level for pull-up driving the internal voltage when the second comparison signal has the first logic level when the first pull-up driving signal has a logic level for pull-up driving the internal voltage.

11. The internal voltage generation circuit of claim 9, wherein the second comparison signal has a second logic level when the internal voltage is a higher level than the reference voltage by a predetermined second voltage difference or more.

12. The internal voltage generation circuit of claim 11, wherein the second driving signal generation circuit generates the second pull-down driving signal having a logic level for pull-down driving the internal voltage when the second comparison signal has the second logic level when the first pull-down driving signal has a logic level for pull-down driving the internal voltage.

13. The internal voltage generation circuit of claim 9, further comprising:
a first driving circuit configured to drive the internal voltage in response to the first pull-up driving signal and the first pull-down driving signal; and
a second driving circuit configured to drive the internal voltage in response to the second pull-up driving signal and the second pull-down driving signal.

14. The internal voltage generation circuit of claim 13, wherein the second driving circuit drives the internal voltage with a greater drivability than that of the first driving circuit.

15. The internal voltage generation circuit of claim 9, wherein the first comparison circuit generates the first comparison signal having a first logic level when the internal voltage is at a lower level than the reference voltage, and generates the first comparison signal having a second logic level when the internal voltage is at a higher level than the reference voltage.

16. The internal voltage generation circuit of claim 9, wherein the first pull-up driving signal is set to a second logic level in synchronization with a time when the internal voltage becomes higher than the reference voltage, and wherein the first pull-down driving signal is set to the second logic level when a predetermined delay period has elapsed where the predetermined delay period starts when the first pull-up driving signal is set to the second logic level.

17. The internal voltage generation circuit of claim 9, wherein the first pull-down driving signal is set to a first logic level in synchronization with a time when the internal voltage becomes lower than the reference voltage and wherein the first pull-up driving signal is set to the first logic level when a predetermined delay period has elapsed where the predetermined delay period starts when the first pull-down driving signal is set to the first logic level.

18. The internal voltage generation circuit of claim 9, wherein the first pull-up driving signal is set to a second logic level in synchronization with a time when the first comparison signal transitions from a first logic level to the second logic level and wherein the first pull-down driving signal is set to the second logic level when a predetermined delay period has elapsed where the predetermined delay period starts when the first pull-up driving signal is set to the second logic level.

19. The internal voltage generation circuit of claim 9, wherein the second driving signal generation circuit includes a PMOS transistor and an NMOS transistor whose sizes are different.

* * * * *